(12) United States Patent
Hartmann

(10) Patent No.: US 6,759,789 B2
(45) Date of Patent: Jul. 6, 2004

(54) SURFACE ACOUSTIC WAVE IDENTIFICATION TAG HAVING AN INTERDIGITAL TRANSDUCER ADAPTED FOR CODE DISCRIMINATION AND METHODS OF OPERATION AND MANUFACTURE THEREOF

(75) Inventor: Clinton S. Hartmann, Dallas, TX (US)

(73) Assignee: RF Saw Components, Inc., Richardson, TX (US)

( * ) Notice: Subject to any disclaimer, the term of this patent is extended or adjusted under 35 U.S.C. 154(b) by 92 days.

(21) Appl. No.: 10/274,299

(22) Filed: Oct. 18, 2002

(65) Prior Publication Data

US 2004/0075361 A1 Apr. 22, 2004

(51) Int. Cl.[7] .............................................. H01L 41/08
(52) U.S. Cl. .............................. 310/313 D; 310/313 R; 310/313 B; 29/25.35
(58) Field of Search ........................ 310/313 R, 313 B, 310/313 D

(56) References Cited

U.S. PATENT DOCUMENTS

| | | | | | |
|---|---|---|---|---|---|
| 4,097,825 | A | * | 6/1978 | Gerard | 333/151 |
| 4,737,790 | A | * | 4/1988 | Skeie et al. | 342/51 |
| 4,746,830 | A | * | 5/1988 | Holland | 310/313 D |
| 4,980,680 | A | * | 12/1990 | Knoll et al. | 340/5.6 |
| 5,469,170 | A | * | 11/1995 | Mariani | 342/51 |
| 5,734,326 | A | * | 3/1998 | Skudera, Jr. | 340/572.1 |
| 6,208,062 | B1 | * | 3/2001 | Nysen et al. | 310/313 R |
| 6,455,979 | B2 | * | 9/2002 | Reindl et al. | 310/313 D |
| 6,693,509 | B2 | * | 2/2004 | Toda | 340/5.64 |

* cited by examiner

Primary Examiner—Mark Budd

(57) ABSTRACT

A surface acoustic wave (SAW) identification tag having a coded transducer and methods of operating and manufacturing the tag. In one embodiment the tag includes: (1) a piezoelectric substrate having a number of reflectors distributed among a group of slots arranged by both pulse position and phase position on the substrate for encoding a number by pulse and phase position; and (2) a SAW transducer located on the substrate for generating a coded interrogation pulse.

20 Claims, 4 Drawing Sheets

SURFACE ACOUSTIC WAVE IDENTIFICATION TAG HAVING AN INTERDIGITAL TRANSDUCER ADAPTED FOR CODE DISCRIMINATION AND METHODS OF OPERATION AND MANUFACTURE THEREOF

TECHNICAL FIELD OF THE INVENTION

The present invention is directed, in general, to a surface acoustic wave (SAW) identification tag and, more specifically, to an interdigital transducer on a SAW tag adapted for code discrimination and methods of operation and manufacture thereof.

BACKGROUND OF THE INVENTION

A number of different types of electronic identification devices are currently being attached to objects for identification of such objects. The various kinds of devices being employed range from ubiquitous bar codes and magnetic strips to the much more sophisticated radio freqrency identification ("RFID") devices. In the case of bar codes and magnetic strips, significant limiting factors include line-of-sight reliability, tag damage and surface dirt problems, and a relatively short effective range. Magnetic strips, for example, generally require the reader to be in direct contact and properly oriented with the strip in order to detect and decode data. In those few cases where a magnetic strip is read with a device other than a direct contact reader, the effective reading range is still only a few centimeters at best. Similarly, the effective range for reliably reading bar codes is also typically no better than a few centimeters, at best. Because the range at which bar codes and magnetic strips can be read is so short, they are usually read one at a time and seldom does one bar code or magnetic strip interfere with another.

The shortcomings of bar code and magnetic strips as identification devices has caused a renewed and revived interest in various RFID tag embodiments. RFID tags can be conveniently divided, as a general rule, into chip tags and chipless tags. Chipless tags generally have about the same read range as bar codes or magnetic strips and, therefore, share a major shortcoming. Prior art RFID chip tags can be fabricated with a significantly longer reliable read range than chipless tags, magnetic strips or bar codes have, but they are generally so expensive that their use is limited to discrete applications where the expense can be economically justified. In most cases, prior art RFID chip tags are individually read and little opportunity exists for tag responses to interfere or collide with one another.

A RFID tag with a long read range that can be inexpensively fabricated has been recently developed. This RFID tag is based on surface acoustic wave (SAW) technology. A complete and detailed description of SAW identification tags 120 is set forth in detail in U.S. patent application Ser. No. 10/024,624, entitled "Surface Acoustic Wave Identification Tag Having Enhanced Data Content and Methods of operation and Manufacture Thereof," Hartmann, Clinton S. ("Hartmann One"), commonly assigned with the invention and incorporated herein by reference. A description of SAW identification tag readers 130 to read such tags is described in detail in U.S. patent application Ser. No. 10/066,249, entitled "Reader For a High Information Capacity Saw Identification Tag and Method of Use Thereof," Hartmann, Clinton S. ("Hartmann Three"), also commonly assigned with the invention and incorporated herein by reference.

Because such tags are inexpensive, they can be attached to a large number of objects (such as all the objects on a shipping pallet) and because they have sufficient range to permit a tag reader to interrogate a large number of tags at the same time, the signal interference or code collision problem caused by multiple responses must be addressed as well as any inter-symbol interference problems caused by so many responses being transmitted at one time. These issues need to be resolved before the full potential of SAW identification tags can be realized.

Accordingly, what is needed in the art are systems and methods that permit a user to reliably distinguish between multiple responses to an interrogation signal that are emanating from SAW tags that are in close proximity.

SUMMARY OF THE INVENTION

To address the above-discussed deficiencies of the prior art, the present invention provides a surface acoustic wave (SAW) identification tag having a coded transducer and methods of operating and manufacturing the tag. In one embodiment the tag includes: (1) a piezoelectric substrate having a number of reflectors distributed among a group of slots arranged by both pulse position and phase position on the substrate for encoding a number by pulse and phase position; and (2) a SAW transducer located on the substrate for generating a coded interrogation pulse.

Thus the present invention provides a partial solution to a potential collision problem. When a large number of response signals are detected when a SAW tag reader sends out an interrogation pulse it is necessary to have a means to electronically identify those responses that have the highest probability of being returned by tags of interest. Where items of interest are identified by locating thereon an embodiment of a SAW identification tag as described herein, a SAW tag reader can be programmed to exclude all tags from consideration as potential candidates for identification except those tags generating a response to a transducer sending a designated coded interrogation pulse.

In one embodiment, the invention provides for the SAW transducer to generate a coded interrogation pulse using phase shift keying while in another embodiment a coded interrogation pulse is generated using frequency shift keying. In still another embodiment the SAW transducer generates a coded interrogation pulse that has the well known Barker code sequence. Those of ordinary skill in the pertinent art will recognize that any type of coding is well within the intended scope of the present invention.

In a particularly beneficial embodiment of the present invention of the SAW identification tag, the coded interrogation pulse is associated with a family of objects. Thus, a SAW identification tag using a predetermined code for an interrogation pulse will always be associated with a specific family of objects.

In still another embodiment of the invention, a SAW identification tag reader is associated with the tag. This association is a powerful anti-collision feature that permits a user to separate tags returning response signals into SAW tags of interest and SAW tags that are not of interest. This permits the SAW identification tag reader to only process reflected pulses from tags that have a predetermined coded interrogation pulse. Thus, because the SAW tag reader is not processing SAW tags that do not have a predetermined coded interrogation pulse, a more efficient and reliable object identification system can be enabled leaving more computer power to be directed to SAW tags that are of interest. In one aspect of this embodiment, the coded interrogation pulse from a specific SAW identification is identified by using code division multiplexing.

The present invention also provides embodiments for the operation and manufacture of a SAW identification tag having a coded transducer. These embodiments are hereinafter described in sufficient detail for one of ordinary skill in the pertinent art to understand The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
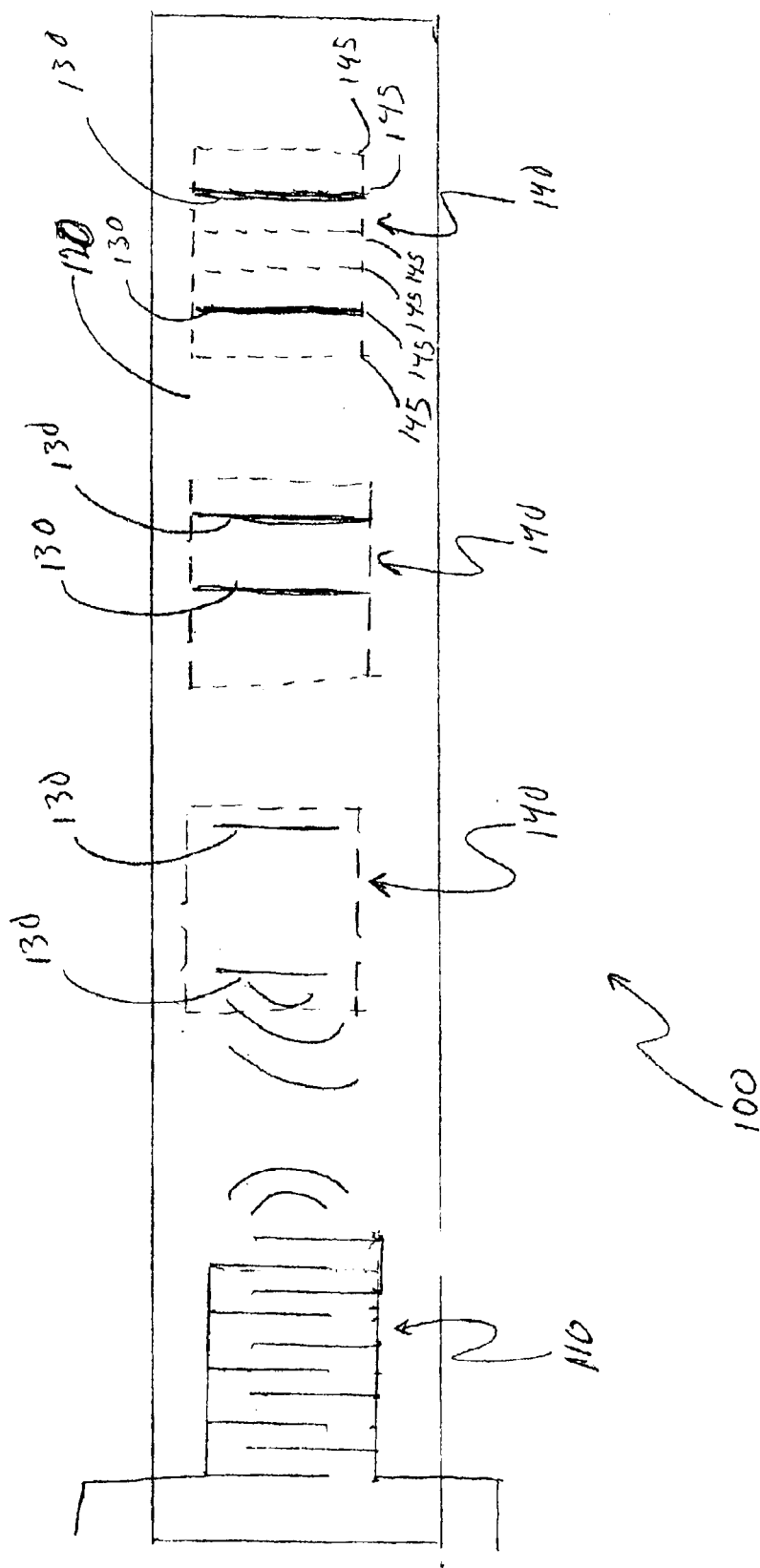
FIG. 1 illustrates a representation of a top planar surface of a SAW identification tag employing an embodiment of a coded transducer constructed in accordance with the present invention.

Referring initially to FIG. 1, illustrated is a representation of a top planar surface of a SAW identification tag 100 employing an embodiment of a coded transducer 110 constructed in accordance with the present invention. The illustrated SAW tag 100 has a piezoelectric substrate 120 on which a number of reflectors 130 are distributed among a group 140 of slots 145. The slots 145 are arranged on the substrate 120 by both pulse and phase position and the reflectors 140 are located within such slots 145 to encode a number by such pulse and phase position.

As those of ordinary skill in the pertinent art understand, a SAW tag 100 is a passive device responding to external stimuli. This stimuli is generated by an associated reader (not illustrated) transmitting an interrogation signal received by the transducer 110 as an electrical pulse. The transducer 110 converts the electrical pulse into a SAW interrogation pulse that propagates along the surface of the substrate 120. Each time the SAW encounters a reflector 130, a portion of the interrogation pulse is reflected as a response pulse. The response pulse is detected by a transducer 110 and converted back into an electrical pulse for transmission as a response signal. This response signal has encoded therein a globally unique identification number determined by the pulse and phase position of the reflectors 130 on the substrate 120.

It goes without saying that the objective of an identification system is to identify one specific item from among a number of items. When items each have a unique SAW tag 100 thereon, the objective of identifying an item and identifying the specific SAW tag 100 on the item is the same. Because SAW tags 100 are passive devices responding to external stimuli, all SAW tags 100 within range of an interrogation signal will return a response signal. When a large number of SAW tags 100 return response signals, collisions occur and it becomes difficult to isolate and identify a specific response from among a large number.

The present invention resolves collisions among a number of response signals by providing a means for identifying and selecting for further processing only those response signals from SAW tags 100 where the a transducer 110 generated a predetermined coded interrogation signal. By thus isolating response signals, the number of signals to be processed is reduced substantially and the probability of accurate decoding is enhanced. The present invention, thus, provides a layer of differentiation between SAW tags 100 responding to an interrogation pulse and substantially reduces the universe of objects or items that are candidates for identification. The present invention is particularly useful when combined with other anti-collision techniques and devices such as those set forth in U.S. patent application Ser. No. 10/103,684, filed on Mar. 21, 2002, entitled "Reader And Response Control System For Discrimination Between Multiple Surface Acoustic Wave Identification Tags and Method of Operation Thereof" to Clinton S. Hartmann, commonly assigned with the invention and incorporated herein by this reference.

Figure 2:
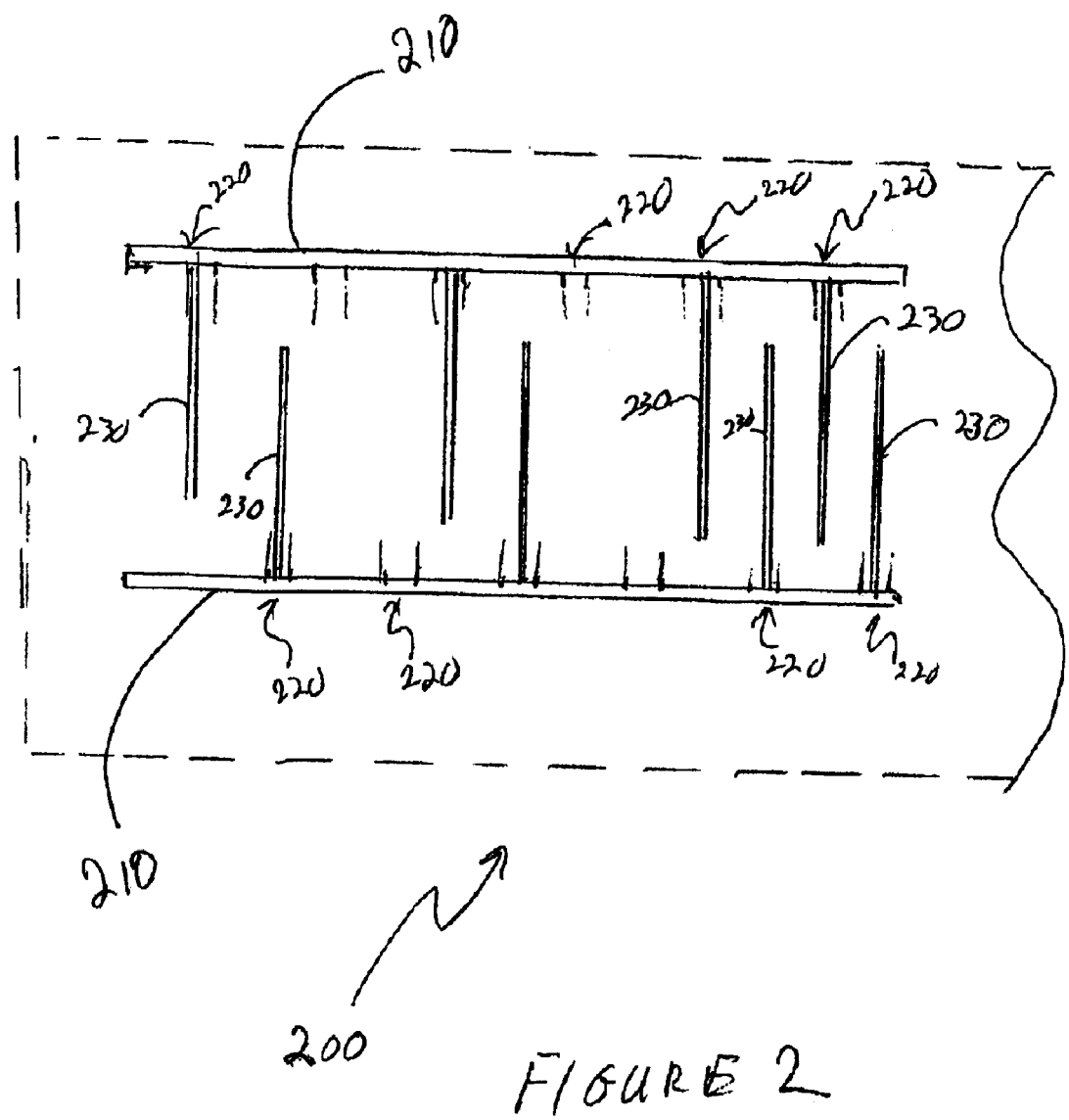
FIG. 2 illustrates a representation of an embodiment of a transducer constructed in accordance with the present invention for generating a coded interrogation pulse by phase shift keying.

Turning now to FIG. 2, illustrated is a representation of an embodiment of a transducer 200 constructed in accordance with the present invention for generating a coded interrogation pulse by phase shift keying. The illustrated interdigital transducer 200 is formed by depositing two electrode 210 arrays on the surface of a SAW tag substrate in an interleaved pattern. Each electrode 210 has a series of equidistant finger locations 220, some of which are occupied by fingers 230 and some of which are unoccupied. The illustrated embodiment provides for six finger locations 220 on each electrode 210 for an aggregate of twelve locations 220. It is the inter-leaven configuration of fingers 230 that permits the interrogation pulse to be coded by using phase shift keying (PSK) techniques. This PSK coded interrogation pulse is then propagated down the SAW tag substrate surface where it encounters reflectors and returns a response pulse having a number encoded therein as described above.

The PSK coded interrogation pulse is produced by a series of fingers 230 that extend from each electrode 210 on the transducer 200 in a predetermined pattern to code the input signal. By way of illustration, if an input signal is viewed as traversing the transducer 200 from left to right, it encounters a series of finger locations 220, some of which are occupied by fingers 230 and some of which are vacant. For coding purposes, each set of four finger locations 220 (two on each electrode 210) will provide one bit of data. In the first set of finger locations 220, fingers 230 in the first two locations 220 (one on each electrode 210) and vacancies in the next two, produce a phase shift in the input signal that can be viewed as the equivalent of a +1 bit of data. As the signal moves through the next four finger locations 220, a similar configuration of fingers 230 produces another +1 data bit. The last four finger locations 220 are occupied by fingers 230 to produce, in this example, a signal encoded as a −1 data bit. As those of ordinary skill in the pertinent art will recognize, the illustrated input signal has produced an interrogation pulse with a three bit Barker code sequence. Those of ordinary skill in the pertinent art will also understand and recognize that any coding type or sequence is well within the intended scope of the present invention.

Figure 3:
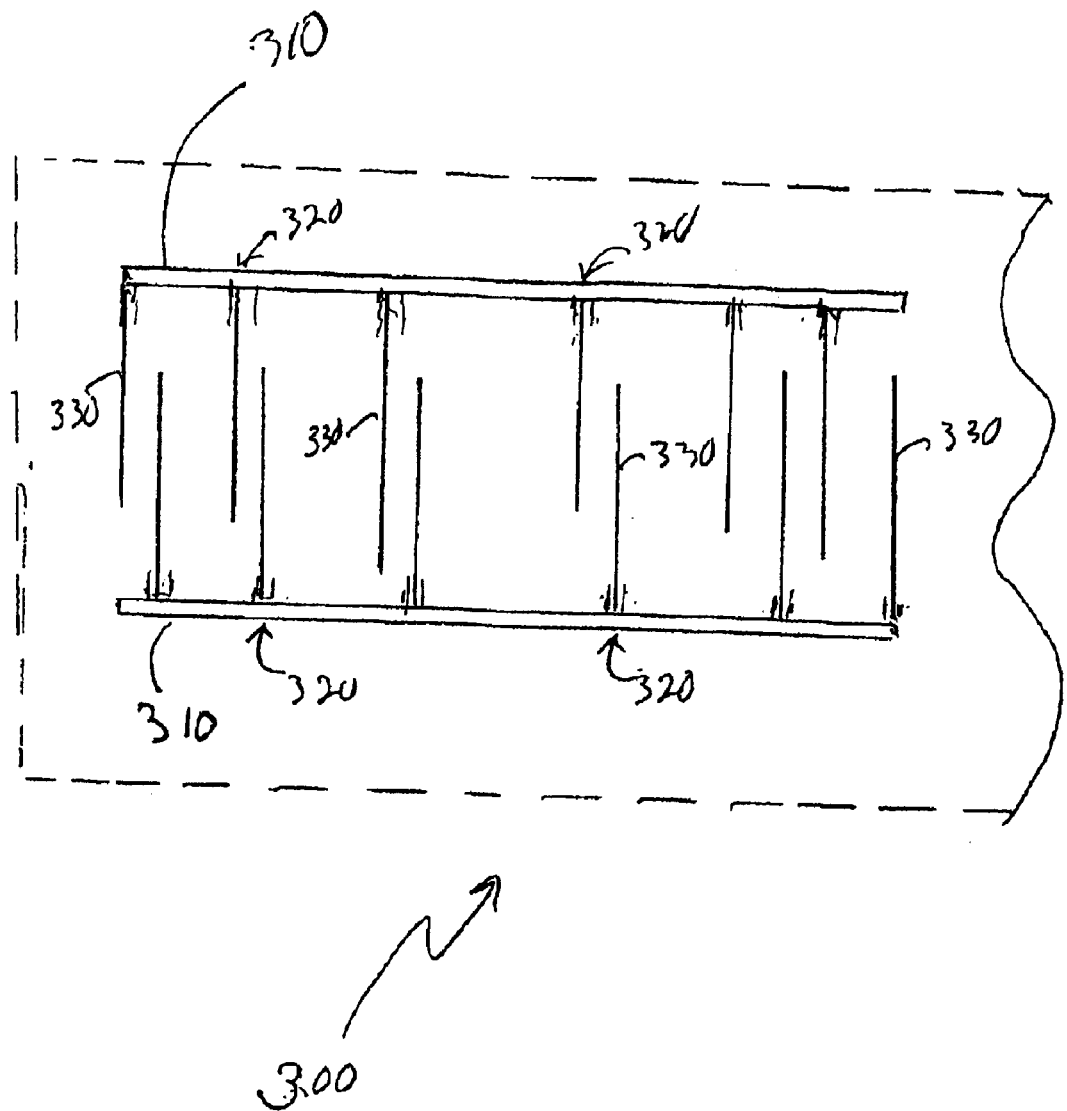
FIG. 3 illustrates a representation of an embodiment of a transducer constructed in accordance with the present invention for generating a coded interrogation pulse by frequency shift keying.

Turning now to FIG. 3, illustrated is a representation of an embodiment of a transducer 300 constructed in accordance with the present invention for generating a coded interrogation pulse by frequency shift keying (FSK). This representation of an interdigitated transducer 300 also has two electrodes 310 with finger locations 320 that have fingers 330 extending in an interleaved pattern to form the interdigitated transducer 300.

It is the pattern of the fingers 330 that provides FSK to code the input signal. Although fingers 330 occupy each of the twelve available finger locations 320, the locations 320 are not evenly spaced on the electrodes 310, as was the case with the finger locations 220 on the transducer 200 illustrated in FIG. 2. Those of ordinary skill in the pertinent art will understand that FSK lends itself to a variety of different coding sequences and structures, all of which are well within the intended scope of the present invention.

A particularly beneficial embodiment of SAW identification tags using the present invention provides for the use and association of coded interrogation pulses with a family of objects. When thus associated, a SAW identification tag identified as producing a response to an interrogation pulse having a particular coding identifies an object as being part of a family of such objects. The beneficial aspects of this embodiment are best understood when considered within the context of a method of operating a SAW identification tag having a coded transducer.

Figure 4:
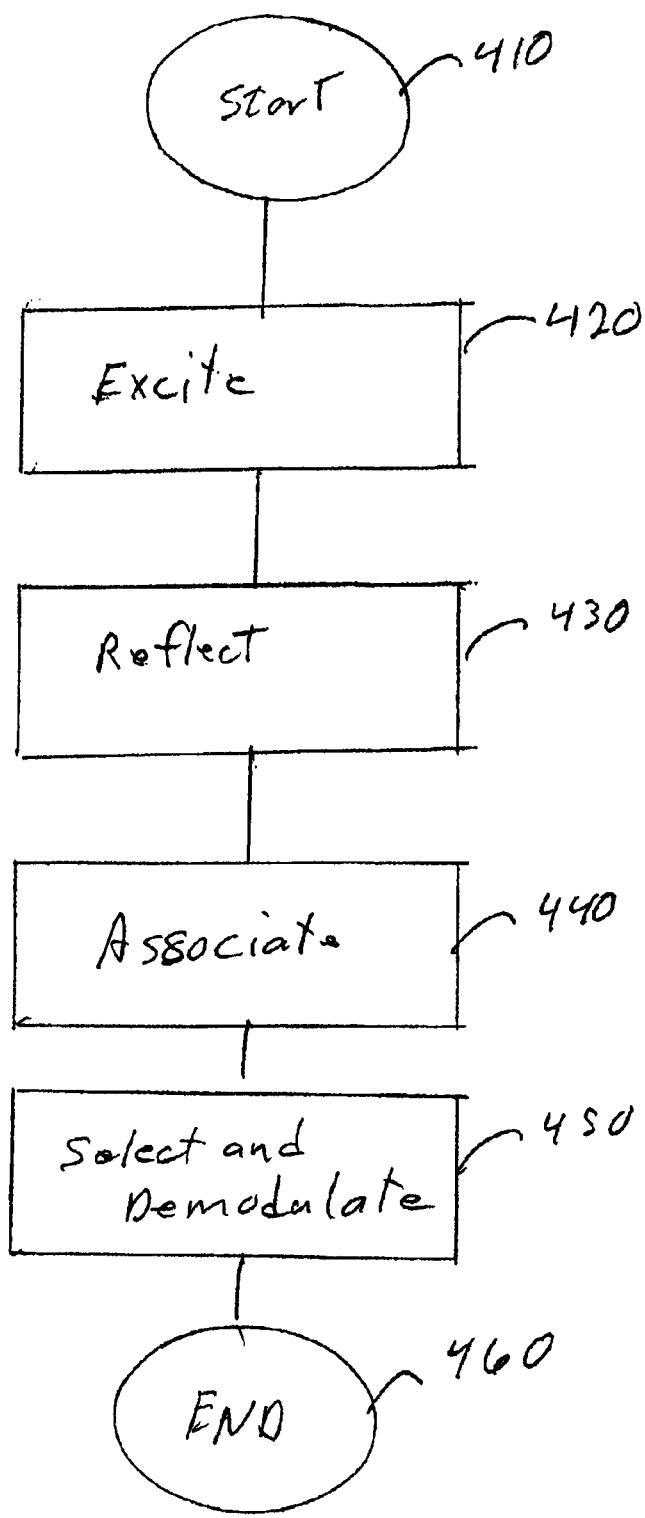
FIG. 4 illustrates a block diagram of an embodiment of a method of operating a SAW identification tag having a coded transducer in accordance with the present invention.

Turning now to FIG. 4, illustrated is a block diagram of an embodiment of a method of operating 400 a SAW identification tag having a coded transducer in accordance with the present invention. The method of operating 400 commences with a start step 410. In an exciting step 420, a SAW transducer located on a piezoelectric substrate is excited by an input signal into producing a coded interrogation pulse. In a reflecting step 430, the coded interrogation pulse reflects from reflectors distributed among a group of slots arranged by both pulse position and phase position on the substrate of the SAW identification tag. In one embodiment an associate reader step 440 provide for a SAW identification tag reader to be associated with the SAW identification tag. In a select and demodulate step 450, a reflected pulse from the coded interrogation pulse is selected and demodulated to yield the number encoded on the SAW tag by both pulse and phase position. The method ends with an end step 460.

In one embodiment of the present invention, the method of operating 400 a SAW identification tag having a coded transducer provides for a coded interrogation pulse that is associated with a family of objects. Such an embodiment may be usefully employed, for example, in identifying objects that are a subset of a larger class of such objects. For example, a hospital surgical suite could associate a group of SAW identification tags with specific surgical instruments used in a specific surgical room or a specific type of surgery. Thus a surgical tool with a SAW identification tag associated with it that produces a certain predetermined coded interrogation pulse could be identified as belonging to the class of surgical tools used in a specific suite or for a specific procedure. Another example would be the identification of inventory items for a chain of stores. Those items having an associated SAW identification tag that produces a certain predetermined coded interrogation pulse could be identified as belonging to a class of items assigned to a specific store.

As those of ordinary skill in the pertinent art will understand, there are a number of situations where the assignment of SAW identification tags to a group or family of objects will be beneficial. The use of SAW identification tags having a transducer that produces a coded interrogation signal provides a convenient way to associate a series of SAW tags with a specific group of objects.

Another embodiment of SAW identification tags having transducers that produce coded interrogation pulses is in environments where signal collision is a problem or is likely to occur. This type of tag provides a powerful anti-collision tool that enables users to separate those tags returning response signals into those of interest and those that are not of interest. For example, a SAW identification tag reader can be programmed to only process identification signals that constitute a response from SAW identification tags that have to a predetermined coded interrogation signal. In one embodiment of the invention, this signal can be determined using by code division multiplexing.

The present invention also provides other embodiments for the operation as well as manufacturing embodiments for a SAW identification tag having a coded transducer, all of which will be understood to those of ordinary skill in the pertinent art from the foregoing description.

Although the present invention has been described in detail, those skilled in the art should understand that they can make various change, substitutions and alterations herein without departed from the spirit and scope of the invention in its broadest form.

What is claimed is:

1. A surface acoustic wave (SAW) identification tag having a coded transducer, comprising:
   a piezoelectric substrate having a number of reflectors distributed among a group of slots arranged by both pulse position and phase position on said substrate for encoding a number by pulse and phase position; and
   a SAW transducer located on said substrate for generating a coded interrogation pulse.

2. The SAW identification tag as recited in claim 1 wherein said SAW transducer generates said coded interrogation pulse using phase shift keying.

3. The SAW identification tag as recited in claim 1 wherein said SAW transducer generates said coded interrogation pulse using frequency shift keying.

4. The SAW identification tag as recited in claim 1 wherein said SAW transducer generates said coded interrogation pulse is coded with a Barker code sequence.

5. The SAW identification tag as recited in claim 1 wherein said coded interrogation pulse is associated with a family of objects.

6. The SAW identification tag as recited in claim 1 further comprising an associated SAW identification tag reader for identification of said coded interrogation pulse.

7. The SAW identification tag as recited in claim 6 wherein said reflected pulse is identified by using code division multiplexing.

8. A method of operating a surface acoustic wave (SAW) identification tag having a coded transducer, comprising:
   exciting a SAW transducer located on a piezoelectric substrate to produce a coded interrogation pulse, said coded interrogation pulse reflecting from reflectors distributed by both pulse position and phase position among a group of slots arranged on said substrate; and
   selecting and demodulating a reflected pulse from said coded interrogation pulse to yield a number encoded by both pulse position and phase position.

9. The method as recited in claim 8 wherein said SAW transducer uses phase shift keying to generate said coded interrogation pulse.

10. The method as recited in claim 8 wherein said SAW transducer used frequency shift keying to generate said coded interrogation pulse.

11. The method as recited in claim 8 wherein said coded interrogation pulse is coded with a Barker code sequence.

12. The method as recited in claim 8 wherein said coded interrogation pulse is associated with a family of objects.

13. The method as recited in claim 8 further comprising associating a SAW identification tag reader with said SAW identification tag for said selecting and demodulating.

14. The method as recited in claim 13 wherein said reflected pulse is identified by using code division multiplexing.

15. A method of manufacturing a surface acoustic wave (SAW) identification tag having a coded transducer, comprising:

depositing a number of reflectors on a piezoelectric substrate such that said reflectors are distributed among a group of slots arranged by both pulse position and phase position for encoding a number by pulse and phase position; and forming a SAW transducer located on said substrate for generating a coded interrogation pulse.

16. The method as recited in claim 15 wherein said SAW transducer uses phase shift keying to generate said coded interrogation pulse.

17. The method as recited in claim 15 wherein said SAW transducer used frequency shift keying to generate said coded interrogation pulse.

18. The method as recited in claim 15 wherein said coded interrogation pulse is coded with a Barker code sequence.

19. The method as recited in claim 15 wherein said coded interrogation pulse is associated with a family of objects.

20. The method as recited in claim 15 further comprising associating a SAW identification tag reader with said SAW identification tag for said selecting and demodulating.

* * * * *

UNITED STATES PATENT AND TRADEMARK OFFICE
CERTIFICATE OF CORRECTION

PATENT NO. : 6,759,789 B2  
DATED : July 6, 2004  
INVENTOR(S) : Clinton S. Hartmann It is certified that error appears in the above-identified patent and that said Letters Patent is hereby corrected as shown below:

<u>Column 6,</u>  
Line 27, "change" should be -- changes --.  
Line 28, "departed" should be -- departing --.

Signed and Sealed this

Seventh Day of December, 2004

JON W. DUDAS  
*Director of the United States Patent and Trademark Office*